(12) United States Patent
Franz et al.

(10) Patent No.: US 7,028,045 B2
(45) Date of Patent: Apr. 11, 2006

(54) COMPRESSING INDEX FILES IN INFORMATION RETRIEVAL

(75) Inventors: Martin Franz, Yorktown Heights, NY (US); Jeffrey Scott McCarley, Bedford Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 563 days.

(21) Appl. No.: 10/056,653

(22) Filed: Jan. 25, 2002

(65) Prior Publication Data

US 2003/0144995 A1 Jul. 31, 2003

(51) Int. Cl.
*G06F 17/00* (2006.01)
(52) U.S. Cl. ............ 707/102; 707/100; 707/101
(58) Field of Classification Search ............ 707/5, 707/9, 10, 4, 2, 1, 200, 102, 101, 100; 705/7; 709/217
See application file for complete search history.

(56) References Cited

U.S. PATENT DOCUMENTS 5,915,249 A * 6/1999 Spencer ............ 707/5
6,704,725 B1 * 3/2004 Lee ............ 707/4
2002/0049760 A1 * 4/2002 Scott et al. ............ 707/10

OTHER PUBLICATIONS

Robertson et al., "Okapi at TREC-3", Proceedings of the Third Text REtrieval Conference (TREC-3). NIST Special Publication 500-226, ed. by D.K. Harman, pp. 109-126, 1995.
Witten et al., "Managing Gigabytes: Compressing and Indexing Documents and Images", Van Nostrand Reinhold, ISBN: 0442018630, pp. 82-95, Jan. 1994.
Baeza-Yates et al., "Modern Information Retrieval", ACM Pres. ISBN: 0-201-39829-X pp. 173-189. May 1999.

* cited by examiner

*Primary Examiner*—Charles Rones
*Assistant Examiner*—Jacob F. Betit
(74) *Attorney, Agent, or Firm*—Frank V. DeRosa; F. Chau & Associates, LLC

(57) ABSTRACT

There is provided a method for compressing an index file in an information retrieval system that retrieves information from a plurality of documents. Each of the plurality of documents has features occurring therein. Each of the features has parameters corresponding thereto. Parameter values corresponding to the parameters of the features are mapped into a plurality of bins. Bin identifiers are stored in the index file. Each of the bin identifiers identifies a bin to which is assigned at least one individual parameter value corresponding to at least one individual parameter.

20 Claims, 6 Drawing Sheets

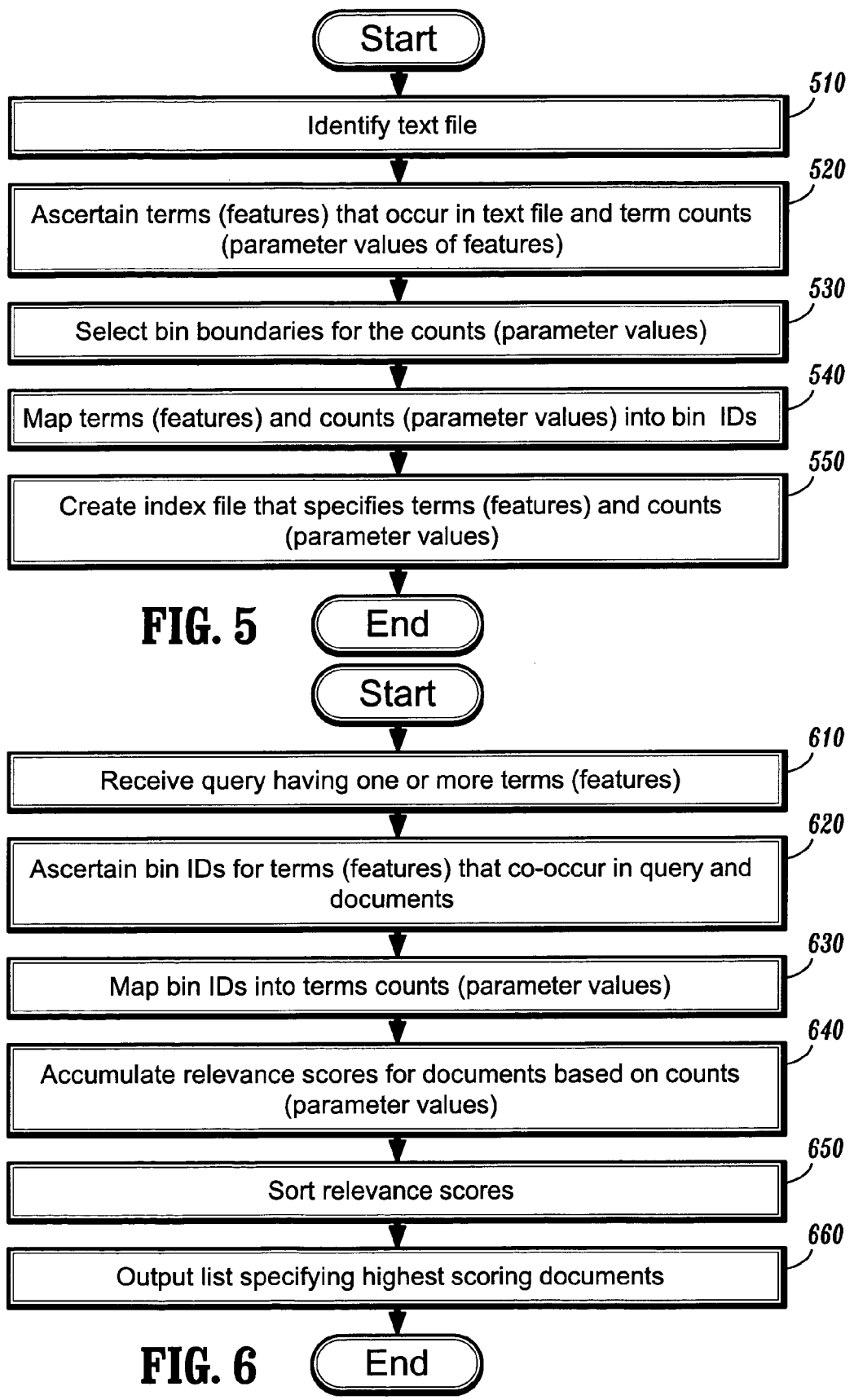

COMPRESSING INDEX FILES IN INFORMATION RETRIEVAL

BACKGROUND OF THE INVENTION

1. Technical Field

The present invention relates generally to information retrieval and, in particular, to compressing index files in information retrieval.

2. Description of Related Art

The purpose of an information retrieval (IR) system is to search a database of documents to find the documents that satisfy a user's information need, expressed as a query.

Most of the current IR systems convert the original text documents into index files, which are used in the actual search. The index file contains information about terms (e.g., words and phrases) found in the individual documents. In particular, a data structure known as an "inverted index" or an "inverted file" stores for each term a list of documents containing the term, together with the number of occurrences (also interchangeably referred to herein as "counts" and "frequencies") of the term in each of the documents. Similarly, a direct (or "word-based") index contains for each document a list of terms with their frequencies in the document. An inverted index is shown in Table 1 and a direct index is shown in Table 2.

TABLE 1 term_1: doc_1, count_1, doc_2, count_2, ...
term_2: doc_1, count_1, doc_2, count_2, ...

TABLE 2 doc_1: term_1, count_1, term_2, count_2, ...
doc_2: term_1, count_1, term_2, count_2, ...

FIG. 1 is a flow diagram illustrating a method for generating an index file for information retrieval, according to the prior art. A text file (e.g., one or more documents) is identified (step 110). Next, terms that occur in the text file as well as counts of those terms are ascertained from the text file (step 120). An index file is created that specifies the terms and counts (step 130). Such an approach requires an extensive amount of media space to store the index file. For example, storing the actual number of occurrences of a term in a document for most applications requires eight or sixteen bits of storage per term and document, allowing for the storage of term frequencies up to 256 or 65536, respectively.

With respect to relevance scoring in information retrieval, most current information retrieval systems estimate the relevance of a document with respect to a query based on the terms co-occurring in the document and the query. Each such term contributes to the total relevance score by a quantity that depends on the following: (1) the frequencies of the term in the query and the document; and (2) the weight assigned to the term based on the frequency of the term in the corpus, e.g., the word "the" occurs in numerous documents and thus its weight is set lower than the weight of the word "computer".

The Okapi formula is an example of such a relevance scoring technique. The Okapi formula is described by: Robertson et al., in "Okapi at TREC-3", Proceedings of the Third Text REtrieval Conference (TREC-3), NIST Special Publication 500-226, ed. by D. K. Harman, pp. 109–26, 1995. According to the Okapi formula, terms in the intersection of the query and document contribute to a relevance score as follows:

$$s = tf * qtf * idf / [c1 + c2 * (dl / avdl) + tf] \quad (1)$$

where tf and qtf are the document and query frequencies for a given term, dl is the document length, avdl is the average length of the documents in the collection, c1 and c2 are constants (e.g. c1=0.5, c2=1.5) and idf is the inverse document frequency, computed as:

$$idf = \log[(N - n + 0.5)/(n + 0.5)] \quad (2)$$

where N is the total number of documents in the collection and n is the number of documents containing the given term.

FIG. 2 is a flow diagram illustrating a method for relevance scoring in information retrieval, according to the prior art.

A query having one or more terms is received (step 210). Counts for terms occurring in the query that also occur in one or more documents (i.e., that co-occur in the query and one or more documents) are respectively ascertained for the one or more documents (step 220). Relevance scores for the one or more documents are accumulated based on the counts (step 230). The relevance scores are then sorted (step 240). A list specifying the highest scoring documents is then output (step 250).

Conventional methods of compressing index files focus on reducing the space required to store the document or word identifier components of the index file. Such conventional methods are summarized by: Witten et al., "Managing Gigabytes: Compressing and Indexing Documents and Images", Van Nostrand Reinhold, ISBN: 0442018630, pp. 82–95, January 1994; and Baeza-Yates et al., "Modern Information Retrieval", ACM Press, ISBN: 0-201-39829-X, pp. 173–89, May 1999. However, as noted above, the storage of term frequencies nonetheless requires a significant amount of memory that increases the overhead of an IR system.

Accordingly, it would be desirable and highly advantageous to have a method for compressing index files in information retrieval that further reduces the media space required for such storage in comparison to prior art approaches for accomplishing the same. For example, such a method should obviate the need to store the actual term frequencies in the index file.

SUMMARY OF THE INVENTION

The problems stated above, as well as other related problems of the prior art, are solved by the present invention, which is directed to compressing index files in information retrieval.

The present invention advantageously lowers the media space required to store the index files used by an information retrieval (IR) system by reducing the amount of memory dedicated to store term frequencies.

Instead of storing the actual term frequencies, the present invention stores, for a given set of terms, only a number that indicates that the frequency values of the each of the terms in the set belong to one of a plurality of previously defined intervals of values. The number of intervals can be chosen to be significantly lower than the number of all possible term frequencies (e.g., only two or four intervals), thus requiring significantly less storage space while achieving retrieval performance close to conventional IR systems. The performance degradation can be further reduced by establishing a set of intervals for each term, based on the statistical properties of the frequency of the term in the indexed corpus.

Moreover, with respect to relevance scoring, the present invention focuses on reducing the space required to store the tf quantities (i.e., the document frequencies for a given term) in the Okapi formula above, or in any other relevance scoring formula that uses term frequencies.

According to an aspect of the present invention, there is provided a method for compressing an index file in an information retrieval system that retrieves information from a plurality of documents. Each of the plurality of documents has features occurring therein. Occurrence frequencies of the features in the plurality of documents are represented in a compressed format in the index file.

According to another aspect of the present invention, the representing step comprises the steps of mapping the occurrence frequencies into a plurality of bins, and storing bin identifiers in the index file. Each of the bin identifiers identify a bin to which at least one individual occurrence frequency is assigned.

According to yet another aspect of the present invention, the method further comprises the step of establishing each of the plurality of bins to represent a numerical interval that contains at least one of the occurrence frequencies.

According to still yet another aspect of the present invention, the method further comprises the step of establishing each of the plurality of bins to represent a different numerical interval, such that the different numerical interval represented by each of the plurality of bins contains a substantially same number of the occurrence frequencies.

According to a further aspect of the present invention, there is provided an apparatus for compressing an index file in an information retrieval system that retrieves information from a plurality of documents. Each of the plurality of documents has features occurring therein. A compression device represents occurrence frequencies of the features in the plurality of documents in a compressed format in the index file.

According to a yet further aspect of the present invention, the compression device comprises a bin generator for generating a plurality of bins and a corresponding plurality of bin identifiers. Each of the plurality of bin identifiers respectively identifies one of the plurality of bins to which at least one individual occurrence frequency is mapped. The compression device further comprises a mapping device for mapping the occurrence frequencies into the plurality of bins, and a storage device for storing the bin identifiers in the index file.

According to a still yet further aspect of the present invention, there is provided a method for compressing an index file in an information retrieval system that retrieves information from a plurality of documents. Each of the plurality of documents has features occurring therein. Each of the features has parameters corresponding thereto. The method comprises the steps of mapping parameter values corresponding to the parameters of the features into a plurality of bins, and storing bin identifiers in the index file. Each of the bin identifiers identifies a bin to which is assigned at least one individual parameter value corresponding to at least one individual parameter.

These and other aspects, features and advantages of the present invention will become apparent from the following detailed description of preferred embodiments, which is to be read in connection with the accompanying drawings.

BRIEF DESCRIPTION OF THE DRAWINGS

FIG. 5 is a flow diagram illustrating a method for generating an index file for information retrieval, according to an illustrative embodiment of the present invention;

FIG. 6 is a flow diagram illustrating a method for relevance scoring in information retrieval, according to an illustrative embodiment of the present invention;

DETAILED DESCRIPTION OF PREFERRED EMBODIMENTS

Figure 1:
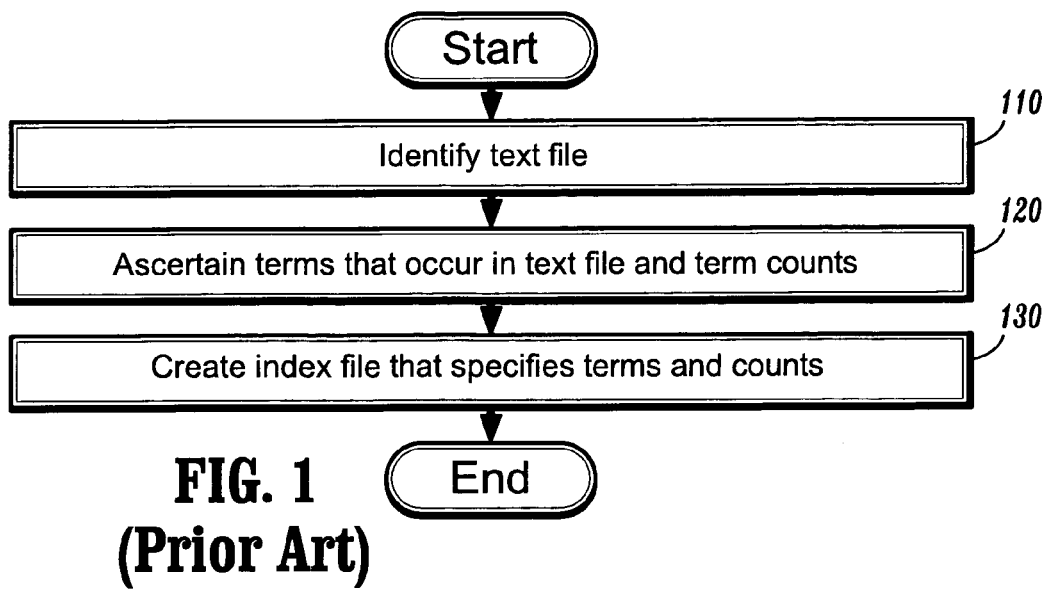
FIG. 1 is a flow diagram illustrating a method for generating an index file for information retrieval, according to the prior art.
Figure 2:
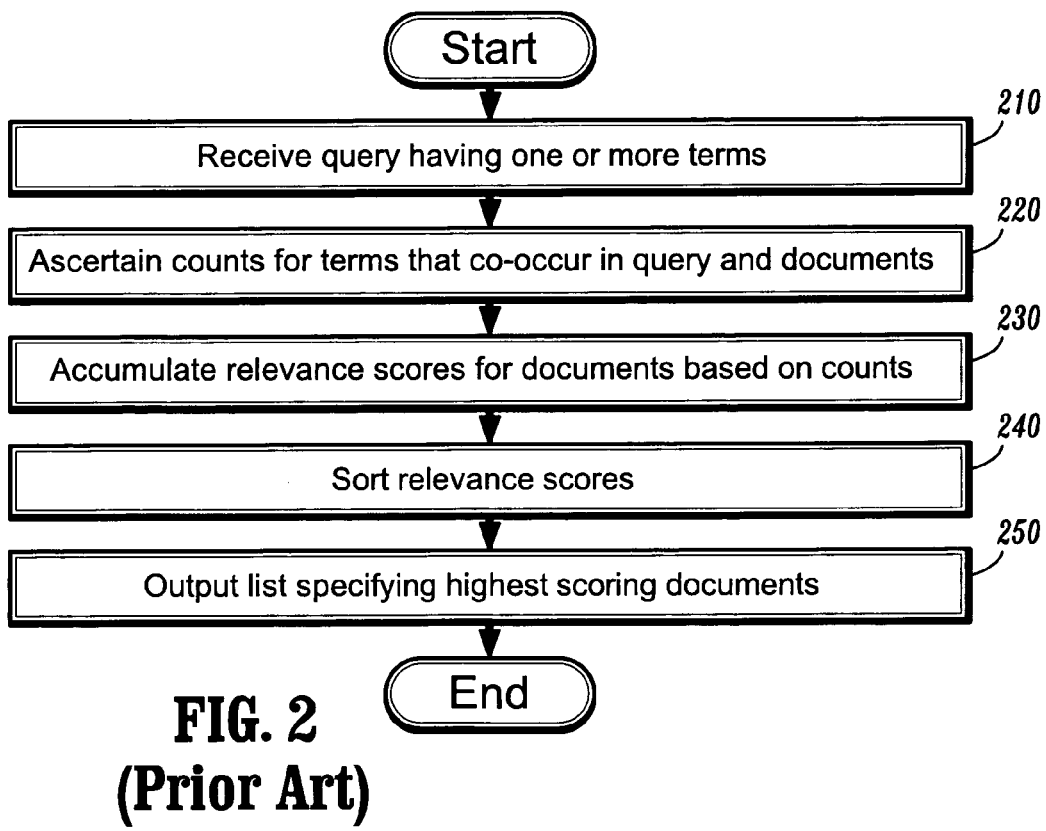
FIG. 2 is a flow diagram illustrating a method for relevance scoring in information retrieval, according to the prior art.

The present invention is directed to a method for compressing index files in information retrieval. Moreover, with respect to relevance scoring, the present invention focuses on reducing the space required to store the tf quantities (i.e., the document frequencies for a given term) in the Okapi formula above, or in any other relevance scoring formula that uses term frequencies. It is to be appreciated that the present invention is applied to features of one or more documents from which information is retrieved. The features may includes text features (e.g., words, phrases, counts thereof, and so forth) and/or non-text features (e.g., images (JPEGs, MPEGs, TIFs, GIFs, etc.), fraction of a video frame occupied by the speaker, and so forth). That is, the present invention may be applied to any items included in one or more documents and may also be applied to characteristics/parameters of those items. As a further of example of a non-text feature, for audio files associated with a plurality of documents, the present invention may be applied to characteristics/parameters of the audio files, including, for example, volume. Moreover, the present invention may be applied to "warped" counts, as described herein below. Given the teachings of the present invention provided herein, one of ordinary skill in the related art will contemplate these and various other items and characteristics/ parameters to which the present invention may be applied, while maintaining the spirit and scope of the present invention.

It is to be understood that the present invention may be implemented in various forms of hardware, software, firmware, special purpose processors, or a combination thereof. Preferably, the present invention is implemented as a combination of both hardware and software, the software being an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof) which is executed via the operating system. In addition, various other peripheral devices may be connected to the computer platform such as an additional data storage device.

It is to be further understood that, because some of the constituent system components depicted in the accompanying Figures may be implemented in software, the actual connections between the system components may differ depending upon the manner in which the present invention is programmed. Given the teachings herein, one of ordinary skill in the related art will be able to contemplate these and similar implementations or configurations of the present invention.

Figure 3:
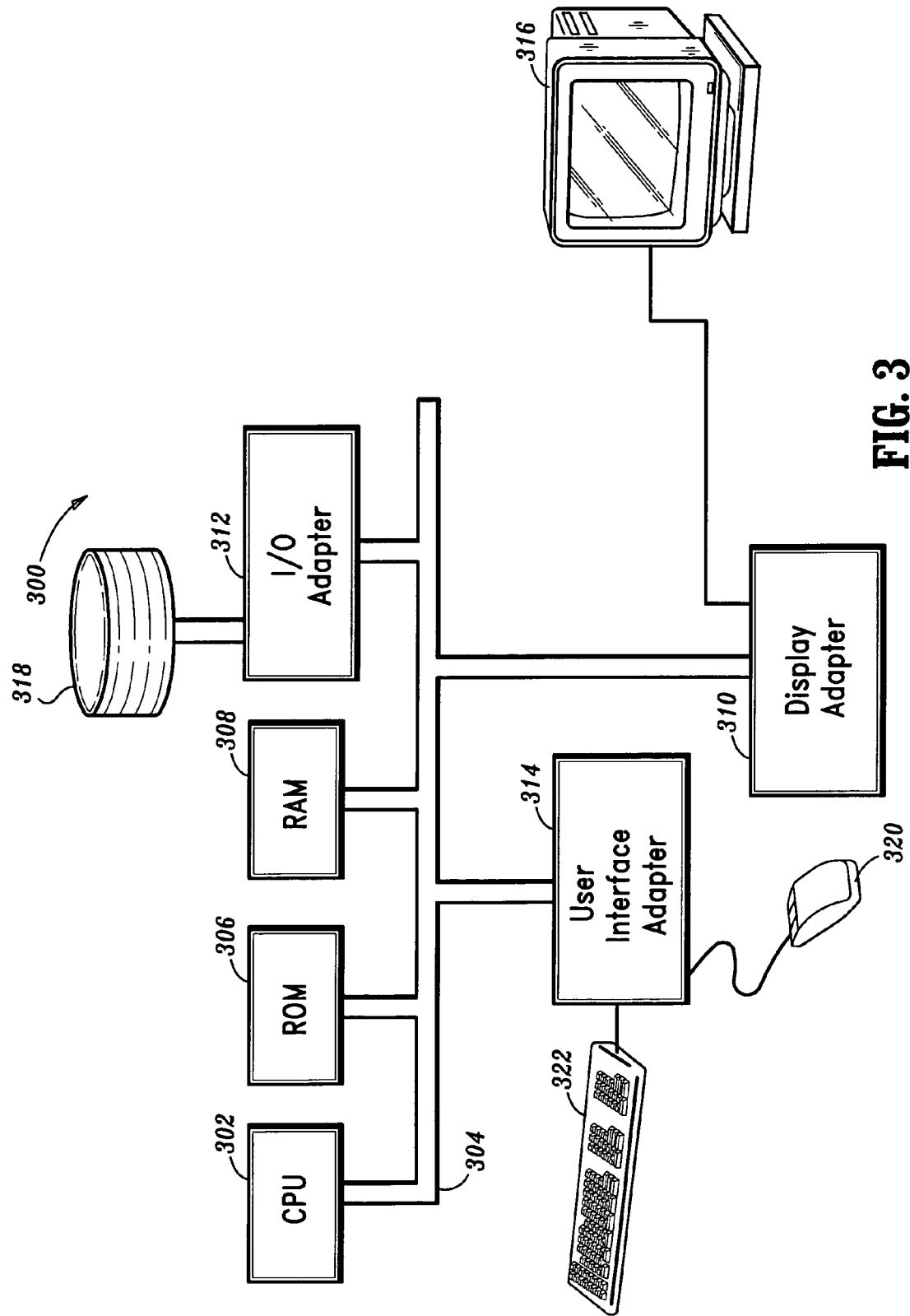
FIG. 3 is a block diagram of a computer processing system 300 to which the present invention may be applied according to an illustrative embodiment thereof.

FIG. 3 is a block diagram of a computer processing system 300 to which the present invention may be applied according to an illustrative embodiment thereof.

The computer processing system 300 includes at least one processor (CPU) 302 operatively coupled to other components via a system bus 304. A read only memory (ROM) 306, a random access memory (RAM) 308, a display adapter 310, an I/O adapter 312, and a user interface adapter 314 are operatively coupled to the system bus 304.

A display device 316 is operatively coupled to the system bus 104 by the display adapter 310. A disk storage device (e.g., a magnetic or optical disk storage device) 318 is operatively coupled to the system bus 304 by the I/O adapter 312.

A mouse 320 and keyboard 322 are operatively coupled to the system bus 104 by the user interface adapter 314. The mouse 320 and keyboard 322 may be used to input/output information to/from the computer processing system 300.

Figure 4:
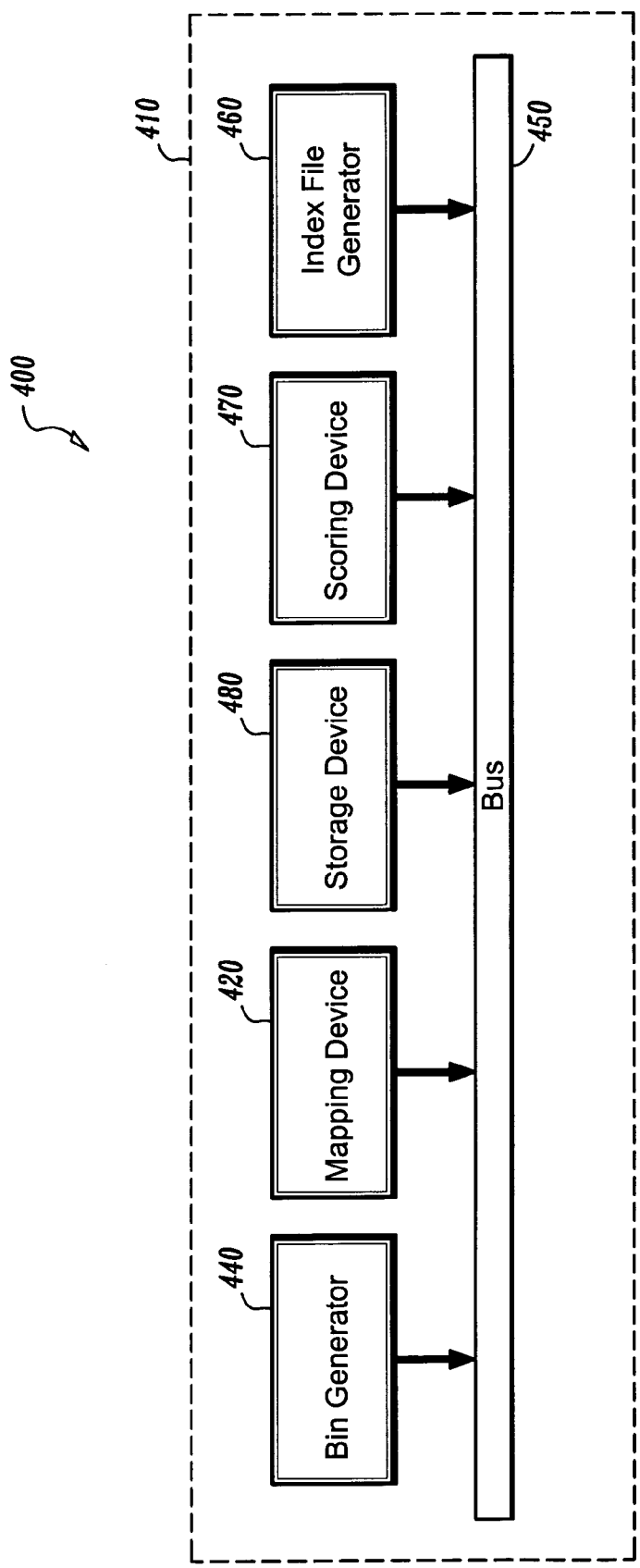
FIG. 4 is a block diagram illustrating an apparatus for compressing an index file in an information retrieval system, according to an illustrative embodiment of the present invention.

FIG. 4 is a block diagram illustrating an apparatus 400 for compressing an index file in an information retrieval system, according to an illustrative embodiment of the present invention. The apparatus 400 includes a compression device 410 which, in turn, includes a bin generator 440, a mapping device 420, a storage device 480, a scoring device 470, and an index file generator 460, all interconnected by a bus 450. The bus 450 may include any means to connect the above elements, as are readily ascertainable by one of ordinary skill in the related art. It is to be appreciated that the storage device 480, the scoring device 470, and the index file generator 460 may be part of the information retrieval system, and thus may not necessarily be included in the apparatus 400 but may simply by utilized the apparatus. In any event, the apparatus 400 will utilize the storage device 480, the scoring device 470, and the index file generator 460, along with the other elements shown in FIG. 4, to compress index files according to the present invention. The operation of the elements of FIG. 4 are described below with respect to FIGS. 5–8.

While preferred embodiments of the present invention of directed to terms and term frequencies occurring in or more documents, as noted above, the present invention may be applied to any features occurring in the one or more documents and any parameters of those features. Accordingly, while FIGS. 5–10 are primarily described with respect to terms and term frequencies, the words "features" and "parameter values" are also provided in brackets to illustrate the equal applicability of the present invention to features that occur in documents and feature parameters associated therewith.

FIG. 5 is a flow diagram illustrating a method for generating an index file for information retrieval, according to an illustrative embodiment of the present invention.

A text file is identified (step 510). Next, terms (features) that occur in the text file as well as counts (parameter values) of those terms (features) are ascertained from the text file, by the index file generator 460 (step 520).

Bin boundaries are then selected for the counts (parameter values), by the bin generator 440 (step 530). The bin boundaries correspond to bins (sets) to which individual term frequency values (parameter values) are assigned. Of course, one or more of the bins may be an empty bin which, at a given time, does not have any term frequency values (parameter values) assigned thereto.

The terms (features) and the counts (parameter values) are mapped into bin IDs, by the mapping device 420 (step 540). An index file is created that specifies the bin IDs, by the index file generator 460 (step 550). Thus, in contrast to the prior art approach of storing the actual document term frequencies, the present invention stores numbers that identify the sets (bins) to which the individual term frequency values are assigned.

FIG. 6 is a flow diagram illustrating a method for relevance scoring in information retrieval, according to the present invention.

A query having one or more terms is received (step 610). Bin IDs for terms (features) occurring in the query that also occur in one or more documents (i.e., that co-occur in the query and one or more documents) are respectively ascertained for the one or more documents, by the bin generator 440 and the index file generator 460 (step 620). It is to be appreciated that the terms (features) in the query for which bin Ids are ascertained at step 620 may include additional terms (features) automatically added in a preprocessing query expansion step.

The bin IDs are mapped into term counts (parameter values), by the mapping device 420 (step 630). Relevance scores for the one or more documents are accumulated based on the term counts (parameter values), by the scoring device 480 (step 640). The relevance scores are then sorted, by the scoring device 480 (step 650). A list specifying the highest scoring documents is then output, by the scoring device 480 (step 660).

Figure 7:
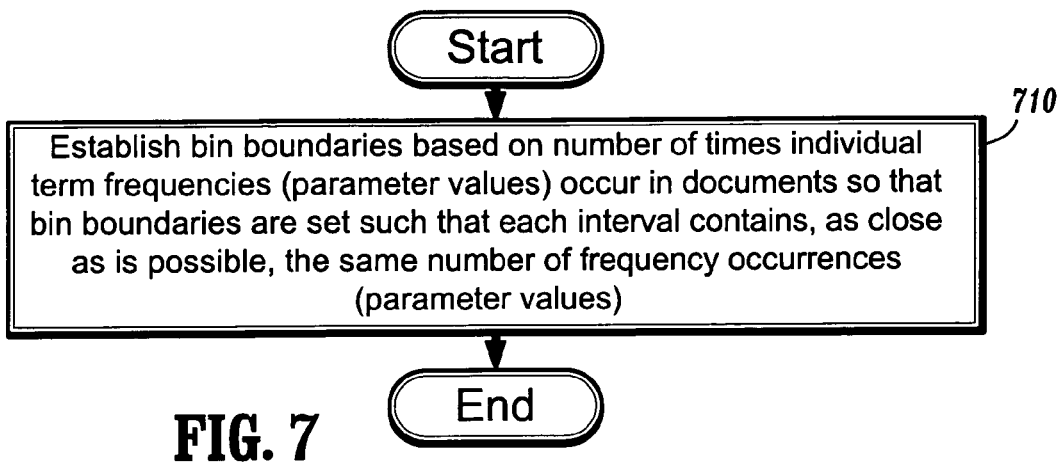
FIG. 7 is a flow diagram further illustrating step 530 of the method of FIG. 5, according to an illustrative embodiment of the present invention.

FIG. 7 is a flow diagram further illustrating step 530 of the method of FIG. 5, according to an illustrative embodiment of the present invention. In particular, FIG. 7 illustrates an exemplary approach to selecting bin boundaries. However, it is to be appreciated that the present invention is not limited to only the approach described below and, thus, other approaches may also be employed. That is, given the teachings of the present invention provided herein, one of ordinary skill in the related art will contemplate these and various other ways in which to select bin boundaries, while maintaining the spirit and scope of the present invention.

One of the ways to establish the bin boundaries is to consider the number of times the individual term frequencies (parameter values) occur in the set of documents to be searched and to set the bin boundaries so that each interval contains, as close as is possible, the same number of frequency occurrences (parameter values) (step 710).

Here is an example: let us consider a (quite small) database in which a term frequency (parameter value) of one occurs 30 times (i.e., in 30 documents), a term frequency (parameter value) of two occurs 10 times, a term frequency (parameter value) of three occurs 5 times, and a term frequency (parameter value) of four occurs 2 times. If we decide to use two bins, the first bin shall contain the term frequency (parameter value) of one, i.e., 30 occurrences, and the second bin wil contain all the other term frequencies (parameter values) for a total of 17 occurrences.

Figure 8:
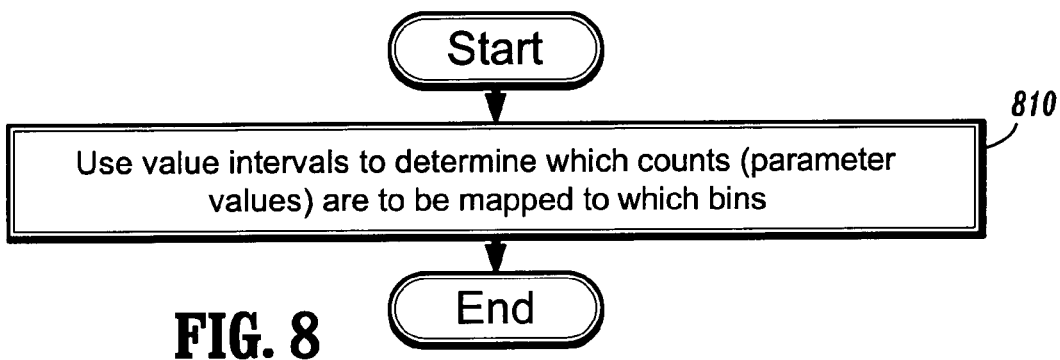
FIG. 8 is a flow diagram further illustrating step 540 of the method of FIG. 5, according to an illustrative embodiment of the present invention.

FIG. 8 is a flow diagram further illustrating step 540 of the method of FIG. 5, according to an illustrative embodiment of the present invention. In particular, FIG. 8 illustrates an exemplary approach to mapping terms (features) and counts (parameter values) into bin IDs. However, it is to be appreciated that the present invention is not limited to only the approach described below and, thus, other approaches may also be employed. That is, given the teachings of the present invention provided herein, one of ordinary skill in the related art will contemplate these and various other ways in which to map terms (features) and counts (parameter values) into bin Ids, while maintaining the spirit and scope of the present invention.

One of the ways to map terms (features) and counts (parameter values) into bin Ids is to use value intervals to determine which counts (parameter values) are to be mapped to which bins (step 810). The range of term count values (parameter values) is divided so that all the term count values (parameter values) smaller than or equal to bin boundary b1 are assigned to Bin 1, all the term count values (parameter values) greater than bin boundary b1 and smaller than or equal to bin boundary b2 are assigned to bin 2, and so on.

Figure 9:
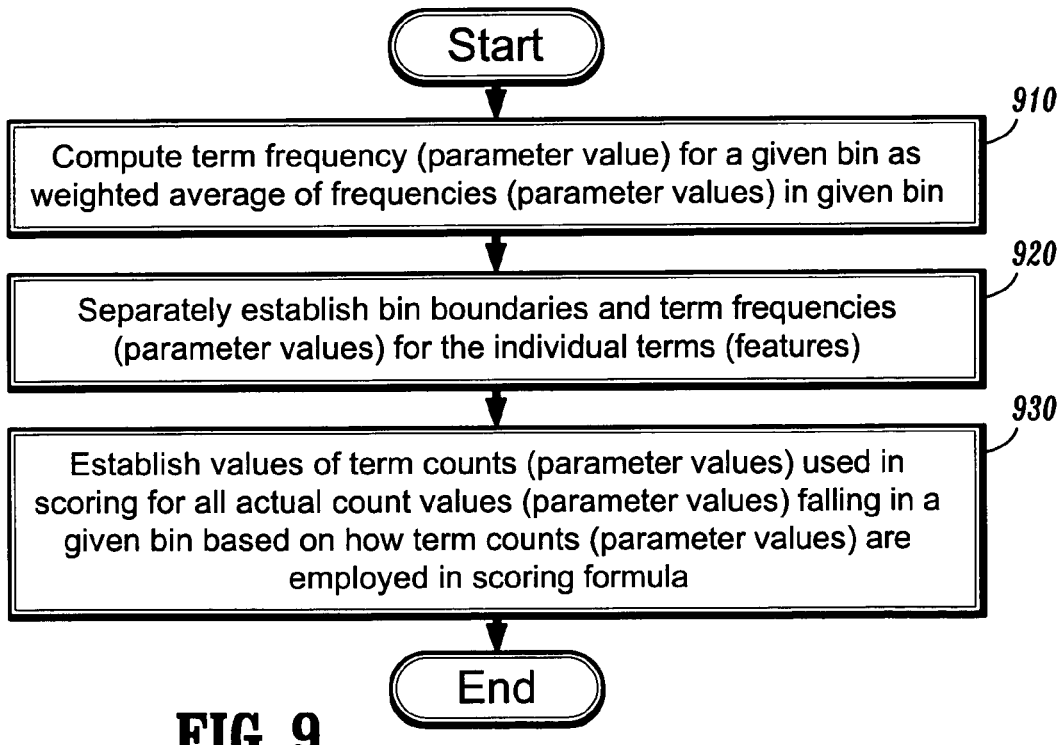
FIG. 9 corresponds to establishing the values of term frequencies used in scoring for all the actual frequency values falling into a given bin, according to an illustrative embodiment of the present invention.

FIG. 9 is a flow diagram further illustrating step 640 of the method of FIG. 6, according to an illustrative embodiment of the present invention. In particular, FIG. 9 illustrates an exemplary approach to relevance scoring based on binning. However, it is to be appreciated that the present invention is not limited to only the approach described below and, thus, other approaches may also be employed. That is, given the teachings of the present invention provided herein, one of ordinary skill in the related art will contemplate these and various other ways in which to score documents based on binning, while maintaining the spirit and scope of the present invention.

In FIG. 9, the values of term frequencies (parameter values) that are used in scoring are established for all the actual frequency values (parameter values) that fall into a given bin. One of the possible approaches is to compute the term frequency (parameter value) for a given bin as the weighted average of the frequencies (parameter values) in the given bin (step 910).

$$tfb = (tf1 * cnt1 + tf2 * cnt2 + \ldots + tfn * cntn)/n \qquad (3)$$

where tfb is the term frequency (parameter value) assigned to the bin, $tf\langle i \rangle$ are term frequencies (parameter values) falling into the bin, $cnt\langle i \rangle$ are the counts of the term frequencies (parameter values), and n is the number of term frequencies (parameter values) falling in the given bin. Using the above example, the term frequency (parameter value) assigned to bin 2 will be $$((2*10) + (3*5) + (2*4))/19 = 2.26$$

Another possible approach is to perform binning independently for each term. The bin boundaries and term frequencies (parameter values) representing the bins are established separately for the individual terms (features) (step 920).

Consider a database containing 2 terms (features), t1 and t2. Term (feature) t1 occurs with frequency (parameter value) 1 in 30 documents, with frequency (parameter value) 2 in 4 documents, and with frequency (parameter value) 3 in 1 document. Term (feature) t2 occurs with frequency (parameter value) 1 in 5 documents, with frequency (parameter value) 2 in 4 documents, with frequency (parameter value) 3 in 4 documents, and with frequency (parameter value) 4 in 3 documents.

We choose 2 bins for each term (feature). For t1, there is bin1 containing frequency (parameter value) 1, and bin2 containing frequencies (parameter values) 2 and 3. Term frequency (parameter value) assigned to bin1, t1 is equal to:

$$(1*30)/30=1$$

Term frequency (parameter value) assigned to bin2, t1 is $$(2*4+3*1)/(4+1)=2.2$$

For t2, there is bin1 containing frequencies (parameter values) 1 and 2, and bin2 containing frequencies (parameter values) 3 and 4. Term frequency (parameter value) assigned to bin1, t2 is equal to:

$$(1*5+2*4)/(5+4)=1.44$$

Term frequency (parameter value) assigned to bin2, t2 is $$(3*4+4*3)/(4+3)=3.43$$

Yet another possible approach reflects the way the term frequencies (parameter values) are applied in the scoring formula. For example, in the above described Okapi formula, the document term frequency (parameter value) part of the relevance score can be written as:

$$s = tf / [c1 + c2 * (dl / avdl) + tf] \qquad (4)$$

where the purpose of the denominator is to: (1) make the dependency sub-linear (n occurrences (parameter values) of a term (feature) contribute to the overall score by less than three times the contribution of a single occurrence (parameter value)); and (2) to perform document length normalization (n occurrences (parameter values) of a term (feature) contribute more to the score of a shorter document then the same n occurrences (parameter values) would contribute to the score of a longer document.) When establishing the values of term counts (parameter values) used in scoring for all the actual count values (parameter values) falling into a given bin, one can reflect the way the term counts (parameter values) are employed (e.g., warped) in the scoring formula (step 930). For example, if the term count (parameter value) for a given bin is computed as the weighted average of the counts (parameter values) in the bins, and when the Okapi formula is used in relevance scoring, then the expression (3) is replaced by:

$$tfb = (sf1 * cnt1 + sf2 * cnt2 + \ldots + sfn * cntn)/n \qquad (3')$$

where st<i> are computed as in (4).

Figure 10:
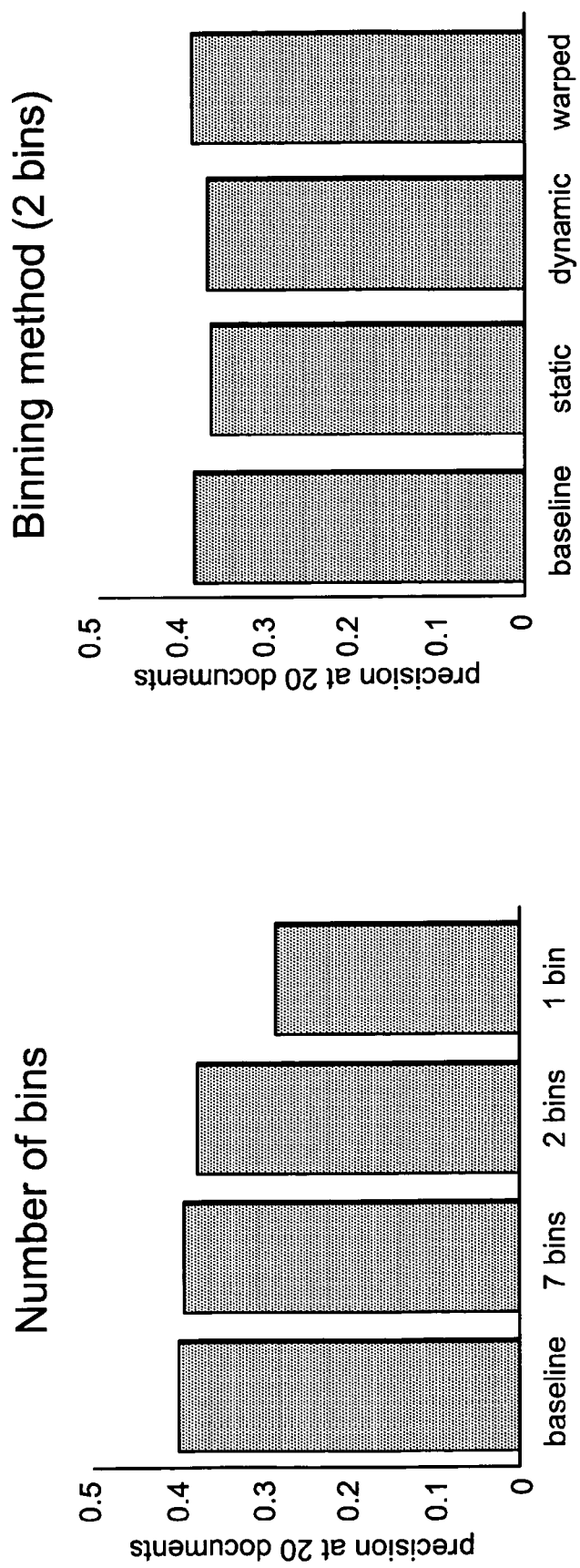
FIG. 10 is a diagram illustrating test results obtained by an illustrative implementation of the present invention.

Referring to FIG. 10, a description will now be given of test results corresponding to an illustrative implementation of the present invention. In particular, the present invention was implemented and tested on a database of approximately 0.5 million documents which represented approximately 2 gigabytes of text. The retrieval performance of a system using two frequency intervals per term is, for most practical purposes, equivalent to the baseline system.

In FIG. 10, "baseline" represents the prior art. "Static" corresponds to the use of the same set of bins for all features (words), as illustratively described with respect to step 910 of FIG. 9. "Dynamic" corresponds to the individual features have separate sets of bins, as illustratively described with respect to step 920 of FIG. 9. "Warped" reflects the way the term frequencies are applied in scoring, as illustratively described with respect to step 930 of FIG. 9.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A computer implemented method for compressing an index file in an information retrieval system that retrieves information from a plurality of documents, each of the plurality of documents having features occurring therein, the method comprising the step of:

representing occurrence frequencies of the features in the plurality of documents in a compressed format in the index file, wherein the compressed format comprises a plurality of bin identifiers for a plurality of bins over which the occurrence frequencies are categorized, wherein said representing step comprises the steps of:

mapping the occurrence frequencies into a plurality of bins; and storing the bin identifiers in the index file, each of the bin identifiers identifying at least one of the bins to which at least one individual occurrence frequency is mapped.

2. The method of claim 1, wherein the features are textual.

3. The method of claim 1, wherein the features are non-textual.

4. The method of claim 1, further comprising the step of assigning a range of values of occurrence frequencies to each bin.

5. The method of claim 1, wherein the step of mapping results in one of the bins being empty.

6. The method of claim 4, wherein assigning comprises assigning a different range of values of occurrence frequencies, such that the different range represented by each of the plurality of bins contains a substantially same number of the occurrence frequencies.

7. The method of claim 1, wherein said mapping step respectively maps more than a single term and a corresponding occurrence frequency into each of the plurality of bins, the method further comprises the step of scoring at least one of the plurality of documents with respect to a query, and said scoring step comprises the step of computing an occurrence frequency for a given one of the plurality of bins as a weighted average of the occurrence frequencies contained within the given one of the plurality of bins.

8. The method of claim 1, wherein said mapping step respectively maps only a single term and a corresponding occurrence frequency into each of the plurality of bins, the method further comprises the step of scoring at least one of the plurality of documents with respect to a query, and said scoring step comprises the step of computing an occurrence frequency for a given one of the plurality of bins based on the single term and corresponding occurrence frequency mapped thereto.

9. The method of claim 1, further comprising the step of establishing bin boundaries for the plurality of bins based on a methodology employed to score the plurality of documents with respect to queries, the bin boundaries defining intervals within which the occurrence frequencies fall.

10. The method of claim 1, further comprising the steps of:

receiving a query having at least one term; and computing a relevance score for at least one of the plurality of documents with respect to the query, based on the bin identifiers.

11. The method of claim 1, wherein the method is implemented by a program storage device readable by machine, tangibly embodying a program of instructions executable by the machine to perform said method steps.

12. An apparatus for compressing an index file in an information retrieval system that retrieves information from a plurality of documents, each of the plurality of documents having features occurring therein, the apparatus comprising:

a compression device that represents occurrence frequencies of the features in the plurality of documents in a compressed format in the index file, wherein the compressed format comprises a plurality of bin identifiers for a plurality of bins over which the occurrence frequencies are categorized, wherein said compression device comprises:

a bin generator that generates the plurality of bins and the corresponding plurality of bin identifiers, each of the plurality of bin identifiers respectively identifying one of the plurality of bins to which at least one individual occurrence frequency is mapped;

a mapping device that maps the occurrence frequencies into the plurality of bins; and a storage device that stores the bin identifiers in the index file.

13. The apparatus of claim 12, wherein the features are textual.

14. The apparatus of claim 12, wherein the features are non-textual.

15. The apparatus of claim 12, wherein said bin generator assigns a range of values of occurrence frequencies to each one of the bins.

16. The apparatus of claim 15, wherein said bin generator assigns a different range of values of occurrence frequencies, such that the different range represented by each of the plurality of bins contains a substantially same number of the occurrence frequencies.

17. The apparatus of claim 12, wherein said mapping device respectively maps more than a single term and a corresponding occurrence frequency into each of the plurality of bins, the apparatus further comprises a scoring device for scoring at least one of the plurality of documents with respect to a query by computing an occurrence frequency for a given one of the plurality of bins as a weighted average of the occurrence frequencies contained within the given one of the plurality of bins.

18. The apparatus of claim 12, wherein said mapping device respectively maps only a single term and a corresponding occurrence frequency into each of the plurality of bins, the apparatus further comprises a scoring device for scoring at least one of the plurality of documents with respect to a query by computing an occurrence frequency for a given one of the plurality of bins based on the single term and corresponding occurrence frequency mapped thereto.

19. The apparatus of claim 12, wherein said bin generator establishes bin boundaries for the plurality of bins based on a methodology employed to score the plurality of documents with respect to queries, the bin boundaries defining intervals within which the occurrence frequencies fall.

20. The apparatus of claim 12, further comprising a scoring device for computing a relevance score for at least one of the plurality of documents with respect to a query, based on the bin identifiers.

* * * * *